United States Patent [19]

Shimada et al.

[11] Patent Number: 4,763,334
[45] Date of Patent: Aug. 9, 1988

[54] LASER BEAM EMITTING APPARATUS

[75] Inventors: Kazuyuki Shimada, Tokyo; Isamu Shibata, Fuchu; Yutaka Kaneko; Susumu Imagawa, both of Yokohama, all of Japan

[73] Assignee: Ricoh Company, Ltd., Tokyo, Japan

[21] Appl. No.: 821,683

[22] Filed: Jan. 23, 1986

[30] Foreign Application Priority Data

Jan. 30, 1985 [JP] Japan .................. 60-16007
Jan. 30, 1985 [JP] Japan .................. 60-16011
Jan. 30, 1985 [JP] Japan .................. 60-16014

[51] Int. Cl.$^4$ .............................................. H01S 3/13
[52] U.S. Cl. .......................... 372/29; 372/38; 372/24; 372/33; 372/43
[58] Field of Search ............... 372/38, 29, 33, 36, 372/107, 43, 34, 31

[56] References Cited

U.S. PATENT DOCUMENTS

| | | | |
|---|---|---|---|
| 3,898,583 | 8/1975 | Shuey | 372/29 |
| 4,003,074 | 1/1977 | Yonezu et al. | 372/36 |
| 4,237,427 | 12/1980 | Holland | 372/29 |
| 4,338,577 | 7/1982 | Sato | 372/36 |
| 4,399,541 | 8/1983 | Kovats et al. | 372/12 |
| 4,562,579 | 12/1985 | Harada | 372/43 |
| 4,567,598 | 1/1986 | Noguchi et al. | 372/36 |
| 4,618,958 | 10/1986 | Shibata et al. | 372/38 |
| 4,661,959 | 4/1987 | Kaneko | 372/107 |

FOREIGN PATENT DOCUMENTS 0096341 12/1983 European Pat. Off. ............. 372/24
0176988 10/1983 Japan ................................... 372/36

OTHER PUBLICATIONS

Wittke et al.; Stabilization of CW Injection Lasers" RCA Tech. Notes, TN No. 1005, Apr. 9, 1975.

Primary Examiner—León Scott, Jr.
Attorney, Agent, or Firm—Cooper & Dunham

[57] ABSTRACT

A laser beam emitting apparatus includes a semiconductor laser, a photodiode for detecting the intensity of the laser beam, an amplifier for amplifying the detection signal from the photodiode, and a variable resistor connected to the amplifier for adjusting the gain of the amplifier. In one embodiment, these elements are provided in a unit structure so that the adjustment of the gain of the amplifier can be carried out in advance. In another embodiment, a collimating lens for collimating the laser beam emitted from the laser is also provided in the same unit. In another embodiment, a single-piece support is provided to support the semiconductor laser, the collimating lens, and an aperture plate formed with an aperture for shaping the collimated laser beam. As a modification, the single-piece support can be made dual in structure while maintaining the structural integrity of the support.

24 Claims, 7 Drawing Sheets

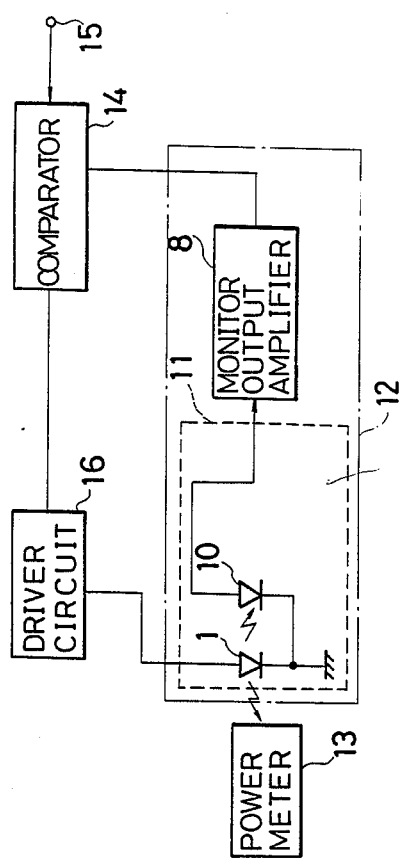
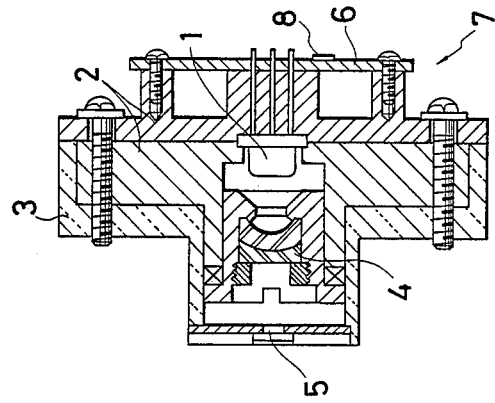
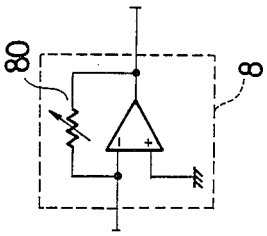

LASER BEAM EMITTING APPARATUS

BACKGROUND OF THE INVENTION

1. Field of the Invention

This invention generally relates to a source for emitting a laser beam, and, in particular, to an apparatus for emitting a laser beam using a semiconductor laser. More specifically, the present invention relates to a light source assembly using a semiconductor laser, which is particularly suitable for use in a light scanning apparatus, such as a laser printer.

2. Description of the Prior Art

A laser printer is well known in the art, and it often uses a semiconductor laser as its laser beam source. Since a laser beam emitted from such a semiconductor laser is divergent in nature, use is also made of a collimating lens to make the laser beam emitted from the semiconductor laser collimated before being used. In some cases, the semiconductor laser and the associated collimating lens are provided in a unit structure to define a laser beam emitting assembly. In this case, the laser beam emitted from the assembly is collimated and thus it can be used in an imaging operation. Thus, the collimated laser beam emitted from the beam source assembly is scanned by scanning means and focused onto an imaging surface by focusing means to form an electrostatic latent image on the imaging surface.

On the other hand, it is also well known that the intensity of the laser beam emitted from a semiconductor laser fluctuates appreciably depending on the temperature of the surrounding atmosphere. In the case where the semiconductor laser is used as a light source in a light scanning system, such as a laser printer, it is particularly required that the intensity of the laser beam be substantially at constant. In order to keep the laser beam intensity at constant, provision is normally made of an optically coupled feedback loop for stabilizing the laser beam intensity at constant. Such an optically coupled feedback loop normally includes a photodetector for receiving the laser beam emitted from the semiconductor laser and a controlling device for controlling the level of the driving current to be supplied to the semiconductor laser so as to keep the intensity of the emitted laser beam to be at constant.

However, since there is a scatter in the sensitivity and the angle of divergence of an emitted laser beam from one semiconductor device from another and there is also a scatter in the sensitivity of the monitoring photodiode, there is a scatter in the relation between the laser beam intensity of the semiconductor laser and the output current of the photodiode. Thus, in the case where the laser beam emitting assembly including the semiconductor laser beam and the photodiode is to be replaced with another assembly for some reason, a power meter must be placed on a photosensitive member for measuring the actual power of the laser beam emitted from the semiconductor laser and a separate gain adjusting unit including, for example, a variable resistor is used to adjust the level of the intensity of the laser beam emitted from the semiconductor laser. This is extremely disadvantageous because the adjustment must be carried out after installment of a semiconductor laser or a laser beam emitting assembly including a semiconductor laser in an apparatus, such as a laser printer. In addition, a power meter must be used for carrying out the adjustment. The characteristic of the power meter also fluctuates, and, thus, the above-described prior art approach does not produce satisfactory results at all times.

SUMMARY OF THE INVENTION

It is therefore a primary object of the present invention to obviate the disadvantages of the prior art as described above and to provide an improved laser beam emitting assembly using a semiconductor laser.

Another object of the present invention is to provide an improved laser beam emitting assembly which allows to carry out adjustments of the output laser beam intensity with ease and yet at high accuracy.

A further object of the present invention is to provide an improved laser beam emitting assembly particularly suited for use in a light scanning apparatus, such as a laser printer.

A still further object of the present invention is to provide an improved light source assembly using a semiconductor laser high in performance and reliable in operation.

Other objects, advantages and novel features of the present invention will become apparent from the following detailed description of the invention when considered in conjunction with the accompanying drawings.

BRIEF DESCRIPTION OF THE DRAWINGS

FIG. 1 is a schematic illustration showing in cross section a laser beam emitting assembly constructed in accordance with one embodiment of the present invention;

FIG. 2 is a block diagram showing an adjusting system for adjusting the laser beam emitting assembly 7 shown in FIG. 1;

FIG. 3 is a circuit diagram showing the structure of the detailed structure of the monitor output amplifier 8 shown in FIG. 2;

DESCRIPTION OF THE PREFERRED EMBODIMENTS

Figure 4:
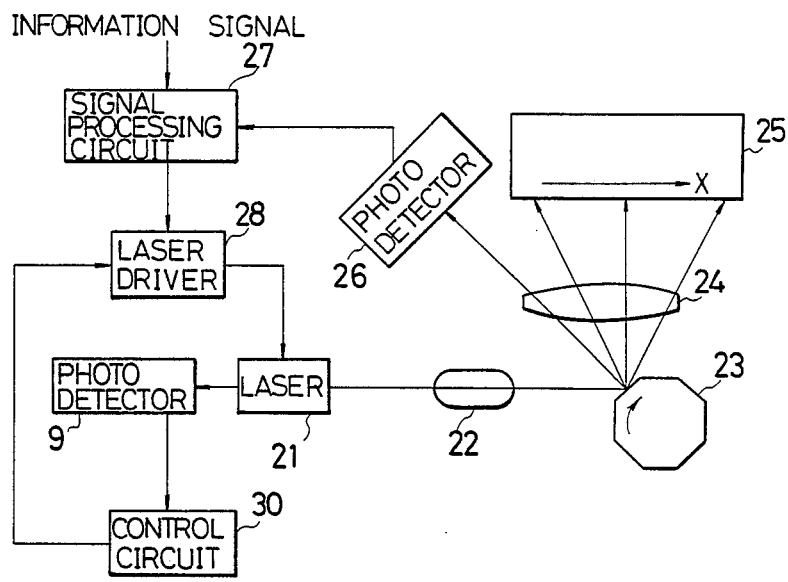
FIG. 4 is a block diagram showing the overall structure of a laser printer to which the present invention may be advantageously applied.

Referring now to FIG. 1, there is schematically shown a laser beam emitting assembly 7 constructed in accordance with one embodiment of the present invention. As shown, the assembly 7 includes a semiconductor laser 1, a metal support plate 2 for supporting thereon the laser 1, an electrically insulating cover 3, a collimating lens 4 fixed in position for receiving a laser beam emitted from the laser 1 and collimating it, an aperture 5 for shaping the collimated laser beam, and a printed circuit board 6 mounted on the support plate 2. The assembly 7 can be detachably mounted in position in a light scanning apparatus, such a laser printer, and used as a source for emitting a laser beam.

In the present embodiment, the printed circuit board 6 constituting an element of the assembly 7 is provided with a monitor output amplifier 8 including a gain adjusting element 80, or a variable resistor in the illustrated embodiment. With this structure, since the gain adjusting element 80 constitutes an element of the assembly 7, the output voltage of the monitor output amplifier can be adjusted in advance to a predetermined reference voltage such that the output power of the laser beam emitted from the semiconductor laser 1 is at an intended level at the surface of a photosensitive member. Thus, even if it is required to replace with the laser beam emitting assembly of a laser printer with a new assembly at the site where the laser printer is installed, the replacement can be carried out without any extensive adjustment using a power meter. Thus, the replacement operation can be carried out expeditiously as well as with ease.

Referring now to FIG. 2, there is shown in schematic an adjusting system for adjusting the laser beam emitting assembly 7 shown in FIG. 1 during its manufacture. The structure shown in FIG. 2, in effect, defines an optically coupled feedback loop for maintaining the intensity of the laser beam emitted from the laser 1 at constant. Thus, the system includes a comparator which is connectable to receive an amplified output from the monitor output amplifier 8. The comparator 14 is also connected to a refence voltage terminal 15 to which a refence voltage corresponding to a desired reference intensity level of a laser beam is applied. The comparator 14 is also connected to a driver circuit 16 which supplies a driver current to the semiconductor laser 1 as modified in accordance with a result of the comparison between the singal from the monitor output amplifier 8 and the refence signal. That is, this aspect of the present invention is characterized in carrying out the adjustment during the manufacture of the present assembly 7, and the adjustment is carried out in the following manner. As shown in FIG. 2, part of the laser beam emitted from the semiconductor laser 1 is received by a monitoring photodiode 10, which is also provided in the assembly 7 though not shown specifically in FIG. 1, and, thus, the monitoring photodiode 10 supplies a detection signal to the monitor output amplifier 8. On the other hand, a power meter 13 is placed on a photosensitive member so as to receive the same laser beam emitted from the semiconductor laser 1. Under the condition, while observing the reading of the power meter 13, the adjusting element 80 of the monitor output amplifier 8 is adjusted until the reading of the power meter 13 reaches a predetermined level.

In FIG. 2, the region indicated by the dotted line 11 shows the structure of a typical prior art laser beam emitting assembly and the region indicated by the one-dotted line 12 shows the structure in accordance with one embodiment of the present invention. As described above and shown in FIGS. 1 and 3, the laser beam emitting assembly 7 embodying the present invention includes the monitor output amplifier 8 which is provided with the gain adjusting element 80. Thus, if the adjustment is once carried out during the manufacture as described above, there is no need to carry out any further adjustment.

Now, the overall structure of a laser printer which is provided with a laser beam emitting assembly as a light source and with an optically coupled feedback loop for stabilizing the intensity of the laser beam emitted from the assembly will be described with reference to FIG. 4. As shown, the laser printer includes a semiconductor laser 21 emitting a laser beam which passes through a collimating lens 22 to be collimated. And, the collimated laser beam is then impinges upon a rotating polygonal mirror 23 to be deflected over a predetermined angle, and the thus deflected laser beam is then passed through a focusing lens 24, or f$\theta$ lens in the illustrated example, to be focused onto an imaging surface 25, or a peripheral surface of a photosensitive drum in the illustrated embodiment. As the polygonal mirror 23 rotates over a predetermined angle, the laser beam deflected by the polygonal mirror 23 scans along an imaginary scanning line in the direction indicated by X across the photosensitive drum 25. It is to be noted that the scanning direction X is often referred to as the main scanning direction. Since the polygonal mirror 23 is provided with a plurality of mirror surfaces arranged along its circumference, as the polygonal mirror 23 rotates clockwise as indicated by the arrow as driven by a motor (not shown), the deflected laser beam scans across the drum 25 in the main scanning direction X repetitively. Although not shown specifically, it should be understood as well known for one skilled in the art that the photosensitive drum 25 is driven to rotate in a predetermined direction at constant speed, which is often referred to as the auxiliary scanning direction, and various image forming units are disposed around the drum 25 and such units typically include charging means, developing means, and transferring means. Thus, the photosensitive drum 25 is uniformly charged to a predetermined polarity before being scanned by the laser beam deflected from the polygonal mirror 23. As will be described in detail later, the laser beam is modulated with image information so that the uniform charge on the drum 25 is selectively dissipated when scanned by the laser beam. In this manner, an electrostatic latent image is formed on the peripheral surface of the drum 25 and it is developed and then transferred to a sheet of transfer paper.

Also provided in the laser printer shown in FIG. 4 is a synchronizing photodetector 26 which is disposed at a location outside of the scanning angle across the photosensitive drum 25 and yet capable of receiving the laser beam deflected by the polygonal mirror 23 and passed through the f$\theta$ lens 24. The photodetector 26 receives the laser beam at the time prior to the initiation of scanning across the photosensitive drum 25 and a detection signal supplied from the photodetector 26 is used for synchronizing the scanning operation. The detection signal supplied from the synchronizing photodetector 26 is supplied to a signal processing circuit 27 which also receives an information signal carrying image information and supplies it as a modulation signal to a semiconductor laser driver 28 in controlled timing according to the detection signal from the synchronizing photodetector 26. In response to the modulation signal thus supplied from the signal processing circuit 57, the semiconductor laser driver 58 drives the semiconductor laser 51 which thus emits the laser beam modulated with information signal and thus carrying image information to be recorded.

It is to be noted that the semiconductor laser 21 also emits a laser beam reawardly and this rearwardly emitted laser beam is received by a stabilizing photodetector 29 which supplies a detection signal indicating the intensity of the laser beam to a control circuit 30, which, in turn, supplies a control signal to the semiconductor laser driver 28 in accordance with the detection signal from the stabilizing photodetector 29, so that the control signal suitably changes the level of driving current to be supplied to the laser 21, thereby maintaining the intensity of the laser beam emitted from the laser 21 to be substantially at constant.

Figure 5:
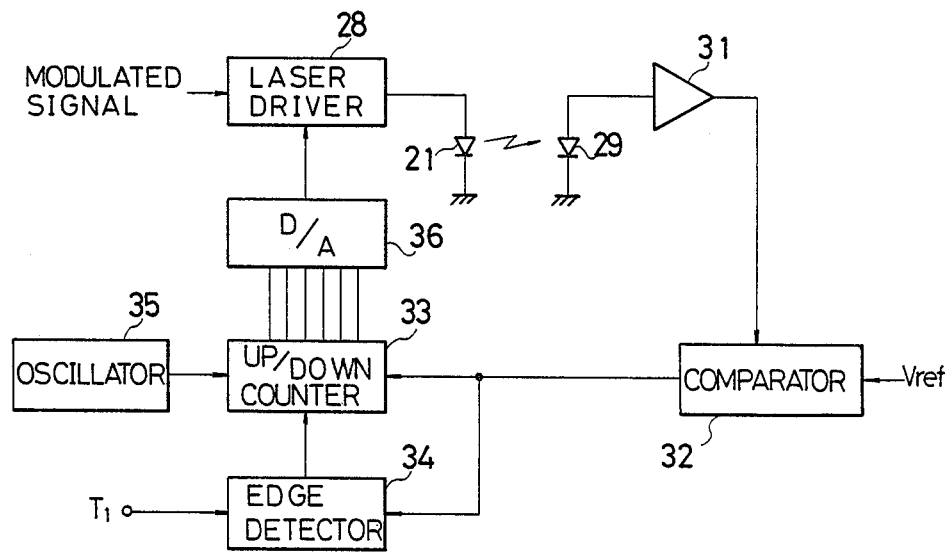
FIG. 5 is a block diagram showing more in detail part of the laser printer shown in FIG. 4.

FIG. 5 shows more in detail the structure of the semiconductor laser driver 28 and the control circuit 30 provided in the laser printer shown in FIG. 4. As shown, the laser beam emitted from the semiconductor laser 21 in the reaward direction is received by the photodetector 29 comprised of a photodiode, which then supplies as its output current whose magnitude is proportional to the intensity of the laser beam. This current is then converted into a voltage by an amplifier 31, which is then supplied to a comparator 32 where the voltage is compared with a reference voltage $V_{ref}$. The comparator 32 supplies an output signal which has either of high or low levels depending on the difference between the detected and reference voltages and which is supplied to an up/down counter 33 to control its mode of operation. For example, if the intensity of the laser beam emitted from the semiconductor laser 21 is lower than a reference value, the output signal of the comparator 32 becomes the low level so that the up/down counter 33 is so set to operate as an up counter. Thus, when a timing signal $T_1$ is supplied to an edge detector 34 which thus allows the up/down counter 33 to be released out of the disabled state, the up/down counter 33 starts to increase its count in accordance with the clock signal supplied from an oscillator 35. The count of this up/down counter 33 is converted into an equivalent analog data by a D/A converter 36, which is then supplied to the semiconductor laser driving circuit 28.

As briefly described previously, in accordance with a modulation signal carrying image information supplied from the signal processing circuit 27, the semiconductor laser driver supplies driving current to the semiconductor laser 21. And, in this instance, the analog data supplied from the D/A converter 36 is amplified by an amplifier (not shown) and this amplified analog data is used to vary the level of the driving current to be supplied to the semiconductor laser 21. Accordingly, as the count of the up/down counter 33 gradually increases, the intensity of the laser beam emitted from the semiconductor laser 21 gradually increases so that the detection voltage obtained by the amplifier 31 increases. As a result, when the output signal of the comparator 32 changes from the low level to the high level, the edge detector 34 detects the rising edge in the output signal of the comparator 32, thereby causing the up/down counter 33 to be disabled. Thus, the up/down counter 33 holds the current count so that the magnitude of the driving current to be supplied to the semiconductor laser 21 is held at the current level.

On the other hand, if the output signal of the comparator 32 is at the high level (because the intensity of the laser beam is too high) at the time when the edge detector 34 has released the disabled state from the up/down counter 33 in accordance with the timing signal $T_1$, then the up/down counter 33 functions as a down counter, thereby decreasing its count in accordance with the clock signal supplied from the oscillator 35. As a result, the level of the analog data output from the D/A converter 36 decreases so that the level of the driving current to be supplied to the semiconductor laser 21 is reduced, which causes the voltage obtained at the amplifier 31 to become smaller. And, when the output voltage of the amplifier 31 has eventually become smaller than the reference voltage $V_{ref}$, the output signal of the comparator 32 changes from the low level to the high level so that the edge detector 34 now detects the rising edge of the output signal of the comparator 32 thereby setting the up/down counter 33 in the disabled state. Accordingly, the up/down counter 33 holds the current count, and thus the magnitude of the driving current to be supplied to the semiconductor laser 21 is maintained at the current level.

If it is so structured that the edge detector 34 sets the up/down counter 33 in the disabled state only when the output signal of the comparator 32 changes from the low level to the high level after the disabled state of the up/down counter 33 having been released by the timing signal $T_1$, when the output signal of the comparator 32 has been changed from the low level to the high level while the disabled state having been released from the up/down counter 33 by the timing signal $T_1$, the up/down counter 33 is set in the disabled state to thereby hold the current count. When the output signal of the comparator 32 changes from the high level to the low level under the conditions that the output signal of the comparator 32 is at the high level and the disabled state is released from the up/down counter 33 by the timing signal $T_1$, the up/down counter 33 remains to be released from the disabled state and serves as an up counter in accordance with the output signal of the comparator 32. Then, when the driving current supplied to the semiconductor laser 21 increases in level and thus the output signal of the comparator 32 changes from the low level to the high level, the edge detector 34 detects its falling edge to cause the up/down counter 33 to be disabled, thereby having the up/down counter 33 hold the current count. For the timing signal $T_1$, use may be made of a print end signal formed by detecting the rising edge of the frame sync signal or the like, and the power setting procedure (stabilization process of the intensity of the laser beam) of the semiconductor laser 21 is carried out advantageously, for example, during frame recording or the like. It should also be noted that the level of intensity of the laser beam emitted from the semiconductor laser 21 is varied by varying the reference voltage signal $V_{ref}$.

Figure 6:
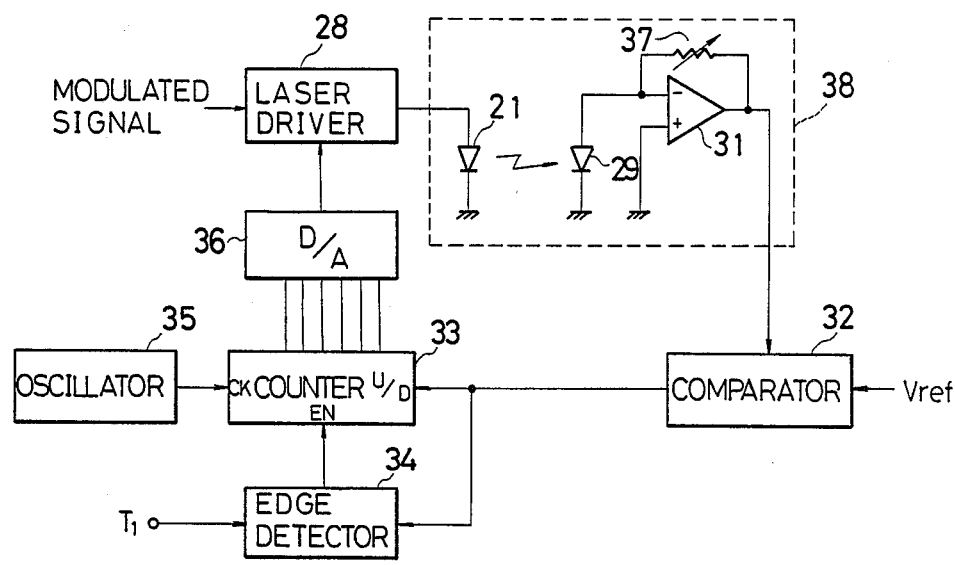
FIG. 6 is a block diagram showing a laser beam emitting assembly using a counter in the optically coupled feedback loop and constructed in accordance with another embodiment of the present invention.

FIG. 6 shows a structure obtained by modifying the structure shown in FIG. 5 and constructed in accordance with a further embodiment of the present invention. Since the structure shown in FIG. 6 is similar to that shown in FIG. 5, like elements are indicated by like numerals and the repetition of description for the like elements is avoided. In accordance with this embodiment, as indicated by the dotted line 38, the semiconductor laser 21, photodetector 29, and amplifier 31 are provided as a unit to define a laser beam emitting assembly, and this unit 38 is further provided with a gain adjusting element 37 or a variable resistor in the illustrated example as connected between the output and inverting input terminals of the operational amplifier 31. It is preferably so structured that this unit 38 is detachably mounted in position in a laser printer so that this unit 38 can be replaced with a new unit if its function deteriorates.

The gain adjusting element 37 adjusts the gain of the operational amplifier 31, and, in the illustrated embodiment, it includes a variable resistor connected between the output and inverting input terminals of the operational amplifier 31. The laser beam emitting assembly or unit 38 is manufactured and then adjusted suitably by the manufacture and then it is distributed to the end user. In adjusting the unit 38, while observing the reading of a power meter to which the laser beam emitted from the semiconductor laser 21 is irradiated, the variable resistor 37 is adjusted such that the output voltage from the amplifier 38 agrees with the reference voltage $V_{ref}$ under the condition that the intensity of the laser beam emitted from the semiconductor laser 21 is at a predetermined level. Thus, such an adjustment can be carried out accurately using the same power meter by the manufacturer.

Figure 7:
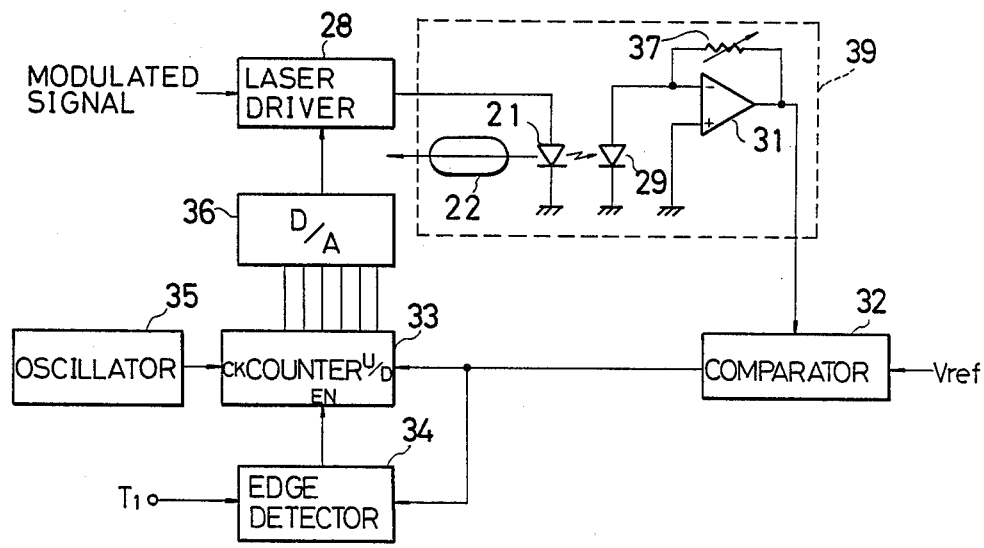
FIG. 7 is a block diagram showing a modification of the structure shown in FIG. 6.

FIG. 7 shows a further modification of the above-described embodiment, in which case, not only the semiconductor laser 21, photodetector 29, amplifier 31, and gain adjusting element 37, but also the collimating lens 22 is also integrated into the same assembly or unit 39. Similarly with the previous embodiment, this embodiment is also manufactured and adjusted by the manufacturer and then distributed to the end user. In this embodiment, since the collimating lens 22 is also included in the unit 39, the scatter in the output intensity of the collimating lens due to the scatter in the angle of divergence of the laser beam emitted from the associated semiconductor laser 21 can also be eliminated.

Figure 8:
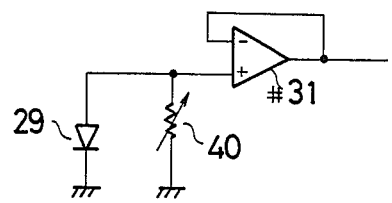
FIG. 8 is a circuit diagram showing a further embodiment of the present invention.

FIG. 8 shows another embodiment of the present invention, in which use is made of a gain adjusting element 40 comprised of a variable resistor as connected between the non-inverting input terminal of the operational amplifier 31 and ground in place of the gain adjusting element 37 in the previous embodiments. In this embodiment, the output terminal of the amplifier 31 is feedback to its inverting input terminal, and the anode of the photodiode 29 is connected to the non-inverting input terminal of the amplifier 31. Thus, in this embodiment, the input signal to the amplifier 31 is suitably adjusted by the gain adjusting element 40.

Figure 10:
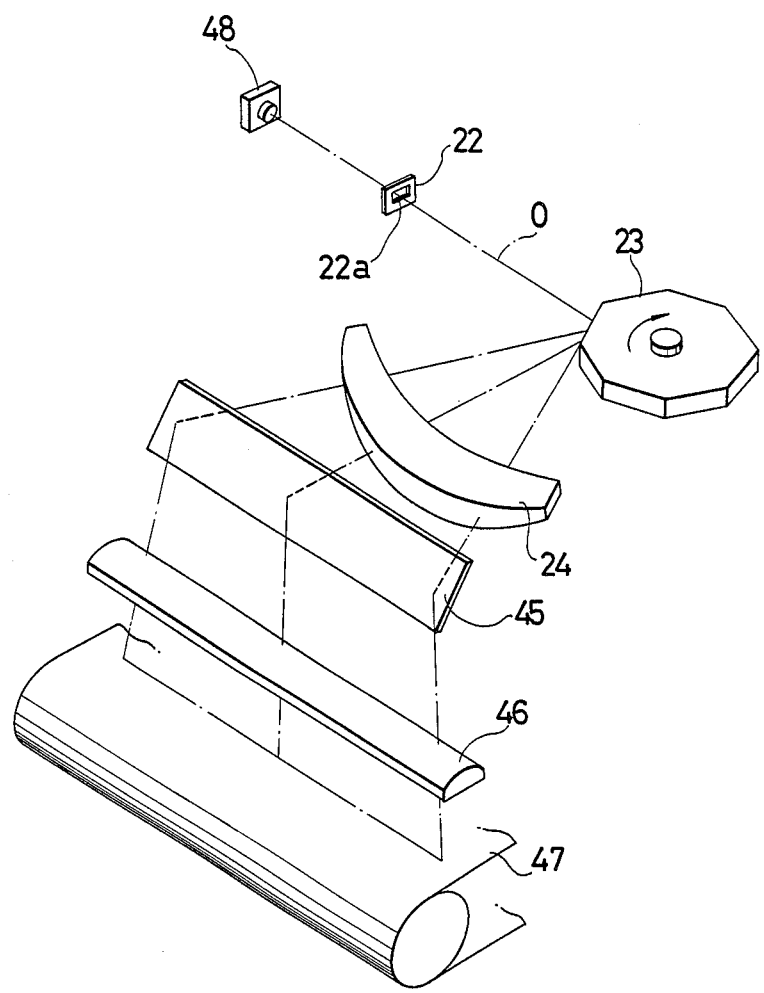
FIG. 10 is a schematic illustration showing in perspective view various physical elements of a typical laser printer to which the present invention may be advantageously applied.

Now, a physical structure of a laser printer using a laser beam emitting assembly including a semiconductor laser will be described with reference to FIG. 10. As shown, the laser beam emitting assembly 48 emits a collimated laser beam which is passed through an aperture 22a provided in an aperture plate, whereby the beam is shaped according to the shape of the aperture 22a, and then the shaped laser beam impinges upon the rotating polygonal mirror 23. Thus, the beam is deflected by the polygonal mirror 23 and the deflected laser beam is passed through the fθ lens 24, reflected by a reflecting mirror 45, passed through a cylindrical lens 46 to be focused onto a photosensitive belt 47 in the form of a spot. As described before, the laser beam emitting from the laser beam emitting assembly 48 is modulated with image information and this laser beam is scanned across the photosensitive belt 47 so that there is formed an electrostatic latent image on the belt 47.

Figure 9:
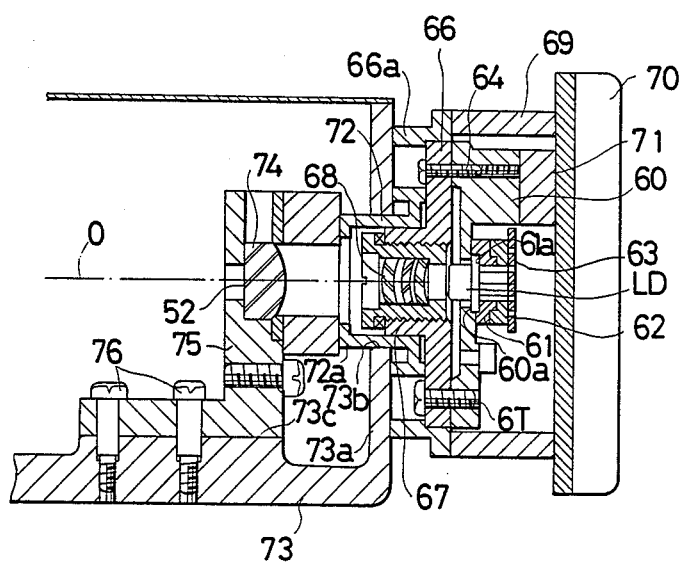
FIG. 9 is a schematic illustration showing in cross section a prior art laser beam emitting assembly using a semiconductor laser.

A typical prior art laser beam emitting assembly 48 including a semicondcutor laser is schematically shown in cross section in FIG. 9. As shown, the laser beam emitting assembly includes a semiconductor laser LD which is mounted in engagement with an engagement hole 60a of a base 60 and an engagement hole 61a of a pressure plate 61. The semiconductor laser LD has pins which are fixed to a printed circuit board 63 which, in turn, is mounted on the base through a spacer 62. The base 60 is fixedly attached to a first flange member 66 by means of mounting screws 64 and 65. A collimating lens 68 is fixedly held by a lens holder 67 which is threaded into the first flange member 66. A heat dissipating fin unit 70 is fixedly attached to the first flange member 66 through a heat-shielding member 69. A Peltier effect element 71 is interposed between the base 60 and the heat-dissipating fin unit 70. The first flange member 66 is provided with a cylindrical portion 66a onto which a second flange member 72 is fitted. The second flange member 22 includes a cylindrical portion 72a which is fitted into a mounting hole 73b formed at one side wall 73a of a housing 73 of the laser beam emitting assembly. Inside of the housing 73, a lens holder 75 for holding a cylindrical lens 74 is fixedly mounted in position by means of a mounting screw 76. The aperture plate 52 is also supported in position by the lens holder 75. The aperture plate 52 is comprised of an opaque material and formed with the aperture 52a which is aligned with a scanning laser beam O. The laser beam emitted from the semiconductor laser LD is collimated by the collimating lens 68, shaped by the aperture 52a, and directed toward the polygonal mirror 23. In this case, the semiconductor laser LD, collimating lens 68, and aperture 52a must be aligned accurately with the scanning beam or on the optical axis of the collimating lens 68. In the structure shown in FIG. 9, since the semiconductor laser LD and collimating lens 68 are provided as an integrated structure, they can be provided at high positional accuracy. However, since the aperture 52 is mounted at the side of the housing 73 to which the assembly of the laser LD and the collimating lens 68 is also mounted, it is difficult to obtain an excellent alignment between the laser LD and the aperture plate 52 or its aperture 52a.

Figure 11:
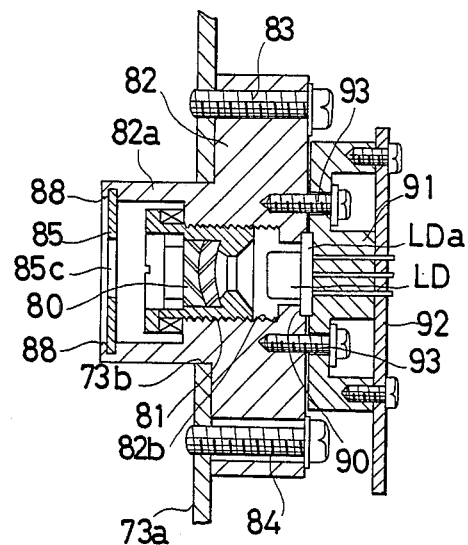
FIG. 11 is a schematic illustration showing in cross section a laser beam emitting assembly constructed in accordance with a still further embodiment of the present invention.
Figure 12:
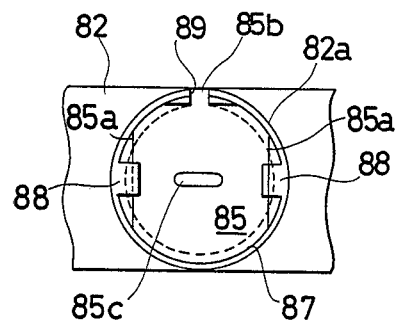
FIG. 12 is a schematic illustration showing in perspective view part of the structure shown in FIG. 11.
Figure 13:
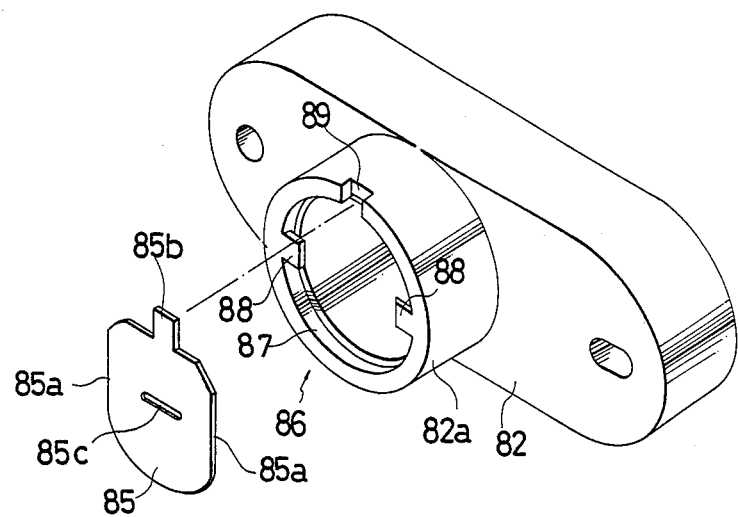
FIG. 13 is a schematic illustration showing in plan view part of the structure shown in FIG. 12.

FIG. 11 shows an embodiment of the present invention which does not suffer from the above-described problem and allows to obtain an excellent alignment among the semiconductor laser, collimating lens, and aperture. As shown, a collimating lens 80 is fixedly mounted in a lens holder 81 which is threadingly mounted on a support 82. The support 82 includes a cylindrical portion 82a which is fitted into a mounting hole 73b formed in a side wall 73a of a housing 73, and the support 82 is fixedly attached to the side wall 73a by means of mounting screws 83 and 84. As also shown in FIGS. 12 and 13, the mouth end of the cylindrical portion 82a is formed with an aperture plate holding section 86 for holding an aperture plate 85 in position. The aperture plate holding section 86 is provided with a circumferential recess 87 for receiving therein the periphery of the aperture plate 85, a pair of engaging projections 88, 88 for engaging with opposite side edges 85a, 85a of the aperture plate 85, and a notch 89 for receiving therein a positioning projection 85b of the aperture plate 85. The aperture 85 is comprised of an opaque and elastic material and it includes a disc-shaped main body, whose periphery is fitted into the circular recess 87, and the positioning projection 85b which is integral with the main body and extends radially therefrom. The main body of the aperture plate 85 is provided with an aperture or shaped window 85c through which the laser beam is passed for shaping the beam. It is so structured that the aperture 85c is located at the center of the circumferential recess 87 when assembled. The circumferential recess 87 is formed to be concentric with the mounting hole 82b formed in the support 82 for mounting therein the lens holder 81.

At the rear side of the support 32 is formed in the shape of a circular recess a semiconductor laser holding section 90, which is located concentric with the mounting hole 83b for the lens holder 81 holding the collimating lens 80 and into which a flange portion LDa of the semiconductor laser LD is fitted. The semiconductor laser LD is fixedly attached to a base 91 and electrically connected to a circuit formed on a printed circuit board 92 which is also fixedly attached to the base 91. The base 91 is fixedly attached to the support 32 by mounting screws 93, 93. As described above, in the present embodiment, the single support 82 is formed with the mounting hole 82b for holding the collimating lens 80 in position, the aperture plate holding section 86 for holding the aperture plate 85 and thus the aperture 85c in position, and the semiconductor laser holding section 90 for holding the semiconductor laser LD in position. Thus, the relative positional accuracy among the laser LD, lens 80, and aperture 85c mostly depends on the manufacturing tolerances in manufacturing the support 82, and such manufacture can be carried out easily by machining at high accuracy. Thus, in accordance with the present embodiment, the laser LD, lens 80, and aperture 85c can be aligned with the optical axis of the lens 80 at high accuracy.

Figure 14:
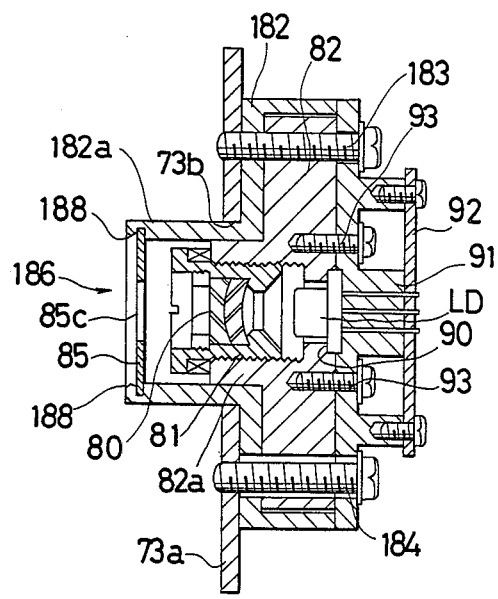
FIG. 14 is a schematic illustration showing in cross section a modification of the structure shown in FIG. 11.

FIG. 14 shows a further embodiment of the present invention which allows to obtain an excellent alignment among selected elements of a laser beam emitting assembly. The structure shown in FIG. 14 is similar to that shown in FIG. 11 in many respects so that like elements are indicated by like numerals, thereby avoiding the repetition of description. The main difference between the embodiments shown in FIGS. 11 and 14 is that the corresponding support in the embodiment of FIG. 14 is dual in structure as different from the single element support 82 is used in the embodiment of FIG. 11. Described more in detail with respect to the embodiment shown in FIG. 14, the laser beam emitting assembly includes the support 82 which is provided with the cylindrical portion 82a onto which a cylindrical portion 182a of a flange member 182 is tightly fitted. The flange member 182 encloses the support 82, and the flange member 182, support 82, and base 91 are together fixedly attached to the side wall 73a of the housing by common mounting screws 183, 184. At the mouth end of the cylindrical portion 182a of the flange member 182 is formed an aperture plate holding section 186, which is similar in structure to the one shown in FIGS. 12 and 13 and which is provided with engaging projections 188, 188. The aperture plate 85 is held at this section 186.

While the above provides a full and complete disclosure of the preferred embodiments of the present invention, various modifications, alternate constructions and equivalents may be employed without departing from the true spirit and scope of the invention. Therefore, the above description and illustration should not be construed as limiting the scope of the invention, which is defined by the appended claims.

What is claimed is:

1. A detachable laser beam emitting assembly for use in a light scanning apparatus having a housing with a mounting hole in which said assembly can be detachably fitted to thereby detachably secure said assembly to said apparatus, said detachable laser beam assembly comprising:

a source for emitting a laser beam;
supporting means for supporting said source, said supporting means including a mounting projection detachably fitting into said mounting hole in said housing of said light scanning apparatus;
detecting means mounted on said supporting means for detecting an intensity of said laser beam by receiving said beam emitted from said source and for supplying as an output a detection signal related to the detected intensity;
amplifying means mounted on said supporting means for amplifying said detection signal; and
gain adjusting means mounted on said supporting means for adjusting a gain of said amplifying means, wherein said laser beam emitting assembly can be detachably mounted in position in said light scanning apparatus as a unit when said mounting projection thereof is fitted into said mounting hole.

2. Assembly of claim 1 further comprising collimating means mounted on said supporting means as spaced apart from said source for collimating said beam emitted from said source.

3. Assembly of claim 2 wherein said detecting means is so mounted on said supporting means for receiving said laser beam without passing through said collimating means.

4. Assembly of claim 2, wherein said source is a semiconductor laser and said detecting means includes a photodidode.

5. Assembly of claim 4 wherein said amplifying means includes an operational amplifier having a pair of inverting and non-inverting input terminals and an output terminal.

6. Assembly of claim 5 wherein said gain adjusting means includes a variable resistor.

7. Assembly of claim 6 wherein said variable resistor is connected between said inverting input and output terminals of said operational amplifier whose inverting input terminal is also connected to receive said detection signal from said photodiode, whereas, said non-inverting input terminal of said operational amplifier is connected to a reference potential.

8. Assembly of claim 7 wherein said reference potential is ground potential.

9. Assembly of claim 6 wherein said inverting input terminal of said operational amplifier is short-circuited to said output terminal thereof and said variable resistor is connected between said non-inverting input terminal of said operational amplifier and a reference potential, whereas, said non-inverting input terminal of said operational amplifier is connected to receive said detection signal from said photodiode.

10. Assembly of claim 9 wherein said reference potential is ground potential.

11. Assembly of claim 2 wherein said supporting means includes a printed circuit board on which said amplifying means and said gain adjusting means are mounted.

12. A laser beam emitting apparatus for use in a light scanning apparatus having a housing having a mounting hole formed therein, said laser beam apparatus comprising:
  a semiconductor laser for emitting a laser beam;
  detecting means for detecting an intensity of said laser beam to supply a detection signal;
  amplifying means for amplifying said detection signal thereby supplying a detection voltage;
  gain adjusting means for adjusting a gain of said amplifying means;
  comparing means for comparing said detecting voltage with a predetermined reference voltage;
  driving means for driving said semiconductor laser by supplying a driving current thereto, said driving means modifying said driving current in accordance with a first signal supplied thereto and having image information to be recorded and a second signal supplied thereto reflecting a result of comparison by said comparing means; and
  supporting means for supporting at least said laser, said detecting means, said amplifying means, and said gain adjusting means as a unit, said supporting means including a mounting projection which can be detachably fitted into said mounting hole formed in said housing of said light scanning apparatus to thereby allow said laser beam emitting apparatus to be detachably mounted in position in said light scanning apparatus.

13. Apparatus of claim 12 further comprising collimating means for collimating said laser beam emitted from said semiconductor laser.

14. Apparatus of claim 13 wherein said collimating means is also supported by said supporting means.

15. Apparatus of claim 14 wherein said detecting means includes a photodiode.

16. Apparatus of claim 15 wherein said amplifying means includes an operation amplifier and said gain adjusting means includes a variable resistor.

17. Apparatus of claim 16 wherein said driving means includes a counter for counting clock pulses supplied from a clock pulse generator, said counter is connected to said comparing means for receiving an output signal therefrom.

18. Apparatus of claim 17 wherein said counter is an up/down counter which increments or decrements its count depending on the condition of said output signal from said comparing means.

19. Apparatus of claim 18 wherein said driving means further includes mode setting means connected to said up/down counter and said comparing means, whereby said mode setting means sets an operational mode of said up/down counter depending on the condition of said output signal from said comparing means.

20. Apparatus of claim 19 wherein said mode setting means includes an edge detector for detecting a predetermined edge of said output signal from said comparing means so as to determine the operational mode of said up/down counter.

21. A laser beam emitting assembly for use in a light scanning apparatus which has a mounting hole formed therein, comprising:
  a semiconductor laser for emitting a laser beam;
  a collimating lens for collimating said laser beam emitted from said laser;
  an aperture plate provided with an aperture through which said collimated laser beam is passed; and
  a support body integrally provided with a first holding section for holding said laser in position, a second holding section for holding said lens in position, and a third holding section for holding said aperture plate in position, whereby said laser, said lens and said aperture are substantially aligned in a optical axis of said lens, said third holding section defining a mounting projection which can be detachably fitted into said mounting hole formed in said light scanning apparatus.

22. Assembly of claim 21 wherein said first holding section is a circular recess formed at one side of said support body in which said laser is partly received to be held in position, said second holding section is a mounting hole formed in said support concentric with said circular recess for receiving therein said lens to be held in position, and said third holding section includes first engaging means provided at a mouth end of a cylindrical projection which is concentric with said circular recess and said mounting hole, said aperture including second engaging means which engages with said first engaging means.

23. Assembly of claim 22 wherein said first engaging means includes a circumferential recess formed at said mouth end of said cylindrical projection and said second engaging means includes at least part of a peripheral portion of said aperture plate, whereby said peripheral portion is fitted into said circumferential recess at least partly.

24. A laser beam emitting assembly for use in a light scanning apparatus having a mounting hole formed therein, comprising:
  a semiconductor laser for emitting a laser beam;
  a collimating lens for collimating said laser beam emitted from said laser;
  an aperture plate provided with an aperture through which was collimated laser beam is passed;
  a first support body integrally provided with a first holding section for holding said laser in position, a second holding section for holding said lens in position, and a first cylindrical projection; and
  a second support body having a second hollow cylindrical projection, which is tightly fitted onto said first cylindrical projection, and integrally formed with a third holding section for holding said aperture plate in position, whereby said laser, said lens and said aperture are substantially aligned in an optical axis of said lens, said second hollow cylindrical projection being capable of being detachably fitted into said mounting hole formed in said light scanning apparatus.

* * * * *